US008921151B2

(12) United States Patent
Van Duren et al.

(10) Patent No.: US 8,921,151 B2
(45) Date of Patent: Dec. 30, 2014

(54) BACK-CONTACT FOR THIN FILM SOLAR CELLS OPTIMIZED FOR LIGHT TRAPPING FOR ULTRATHIN ABSORBERS

(71) Applicant: Intermolecular, Inc., San Jose, CA (US)

(72) Inventors: Jeroen Van Duren, Palo Alto, CA (US); Haifan Liang, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 94 days.

(21) Appl. No.: 13/737,846

(22) Filed: Jan. 9, 2013

(65) Prior Publication Data
US 2013/0143355 A1 Jun. 6, 2013

Related U.S. Application Data

(62) Division of application No. 13/283,291, filed on Oct. 27, 2011, now Pat. No. 8,852,989.

(51) Int. Cl.
H01L 31/18 (2006.01)
H01L 31/0224 (2006.01)
H01L 31/0236 (2006.01)

(52) U.S. Cl.
CPC ........ *H01L 31/18* (2013.01); *H01L 31/022425* (2013.01); *H01L 31/02366* (2013.01); *Y02E 10/50* (2013.01)
USPC .......................................................... 438/98

(58) Field of Classification Search
CPC ............ H01L 31/0322; H01L 31/0749; H01L 21/02568; H01L 21/02614; H01L 31/0326
USPC .......................................................... 438/98
See application file for complete search history.

(56) References Cited

U.S. PATENT DOCUMENTS

2011/0097841 A1* 4/2011 Krasnov et al. ................. 438/98
2011/0240997 A1* 10/2011 Rockenberger et al. ........ 257/49

* cited by examiner

Primary Examiner — Tony Tran

(57) ABSTRACT

Methods for increasing the power output of a TFPV solar panel using thin absorber layers comprise techniques for roughening and/or texturing the back contact layer. The techniques comprise roughening the substrate prior to the back contact deposition, embedding particles in sol-gel films formed on the substrate, and forming multicomponent, polycrystalline films that result in a roughened surface after a wet etch step, etc.

7 Claims, 6 Drawing Sheets

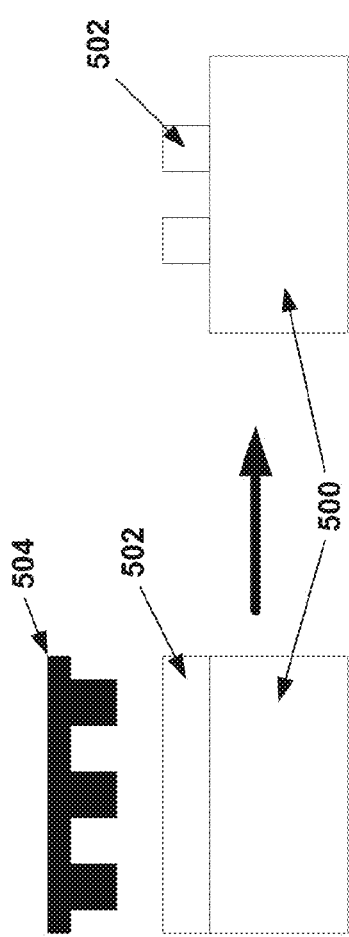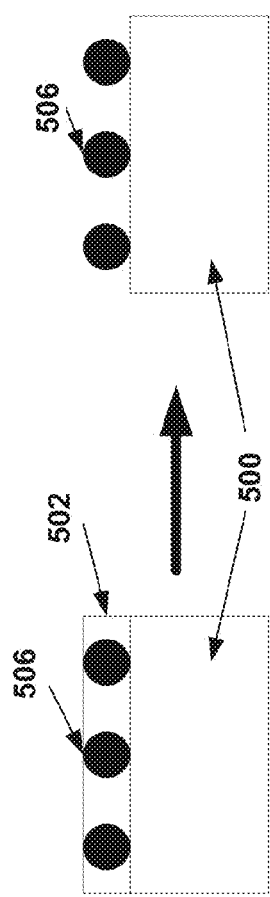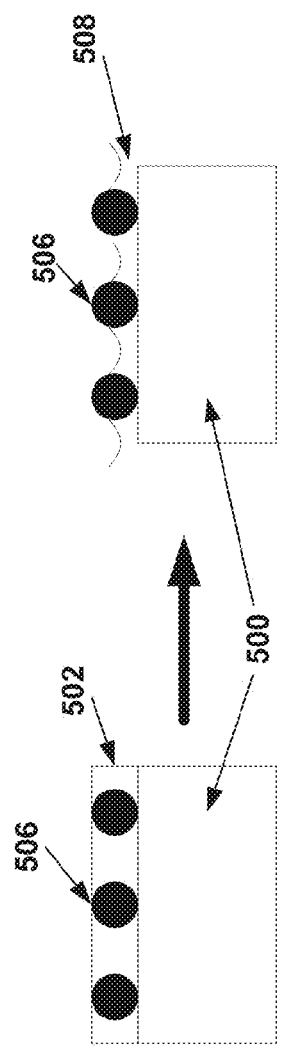

BACK-CONTACT FOR THIN FILM SOLAR CELLS OPTIMIZED FOR LIGHT TRAPPING FOR ULTRATHIN ABSORBERS

CROSS-REFERENCE TO RELATED APPLICATIONS

This is a Divisional Application of U.S. patent application Ser. No. 13/283,291, filed on Oct. 27, 2011, which is herein incorporated by reference for all purposes.

FIELD OF THE INVENTION

The present invention relates generally to methods for developing back contacts for thin film solar cells. More specifically, methods of developing back contacts for copper indium gallium (sulfide) selenide (CIG(S)Se, or CIGS) solar cells, cadmium telluride (CdTe) solar cells, and copper zinc tin (sulfide) selenide (CZT(S)Se, or CZTS) solar cells.

BACKGROUND OF THE INVENTION

Solar cells are photovoltaic (PV) devices that convert light into electrical energy. Solar cells have been developed as clean, renewable energy sources to meet growing demand. Solar cells have been implemented in a wide number of commercial markets including residential rooftops, commercial rooftops, utility-scale PV projects, building integrated PV (BIPV), building applied PV (BAPV), PV in electronic devices, PV in clothing, etc. Currently, crystalline silicon solar cells (both single crystal and polycrystalline) are the dominant technologies in the market. Crystalline silicon (cSi) solar cells must use a thick substrate (>100 um) of silicon to absorb the sunlight since it has an indirect band gap. Also, the absorption coefficient is low for crystalline silicon because of the indirect band gap. The use of a thick substrate also means that the crystalline silicon solar cells must use high quality material to provide long carrier lifetimes to allow the carriers to diffuse to the p-n junction. Therefore, crystalline silicon solar cell technologies lead to increased costs. Thin film photovoltaic (TFPV) solar devices based on amorphous silicon (a-Si), CIGS, CdTe, CZTS, etc. provide an opportunity to increase the material utilization since only thin films (<10 um) are generally required. The thin film solar cells may be formed from amorphous, nanocrystalline, micro-crystalline, or mono-crystalline materials. TFPV devices may have a single device configuration (i.e. they are comprised of a single light conversion device) or they may have a tandem configuration wherein multiple TFPV devices are used to increase the absorption efficiency within different wavelength regions of the incident light spectrum.

TFPV devices provide an opportunity to reduce energy payback time, and reduce water usage for solar panel manufacturing. CdTe and CZTS films have band gaps of about 1.5 eV and therefore, are efficient absorbers for wavelengths shorter than about 800 nm. The absorption coefficient for CdTe is about $10^5$/cm and the absorption coefficient for CZTS is about $10^4$/cm. CIGS films have bandgaps in the range of 1.0 eV (CIS) to 1.65 eV (CGS) and are also efficient absorbers across the entire visible spectrum. The absorption coefficient for CIGS is also about $10^5$/cm. Among the thin film solar technologies, CIGS has demonstrated the best lab cell efficiency (over 20%) and the best large area module efficiency (>15%).

A general class of PV absorber films of special interest is formed as multinary compounds from Groups IB-IIIA-VIA of the periodic table. Group IB includes Cu, Ag, and Au. Group IIA includes B, Al, Ga, In, and Tl. Group VIA includes O, S, Se, Te, and Po. Additionally, the IB-IIIA-VIA materials can be doped with dopants from Groups VIII, IIB, IVA, VA, and VIIA of the periodic table. Group VII includes Fe, Ru, Os, Co, Rh, Ir, Ni, Pd, and Pt. Group IIB includes Zn, Cd, and Hg. Group IVA includes C, Si, Ge, Sn, and Pb. Group VA includes N, P, As, Sb, and Bi. Group VIIA includes F, CI, Br, I, and At. Other potential absorber materials of interest include cuprous oxide, iron sulfide, etc.

TFPV devices can be fabricated at the cell level or the panel level, thus further decreasing the manufacturing costs. As used herein, the cell level is understood to mean an individual unit that can be combined with other units to form a module. The cells may be rigid or flexible. As used herein, the panel level is understood to mean a large TFPV structure that is not composed of smaller units. Generally, the panels are similar in size to the aforementioned modules. For economy of language, the phrase "TFPV device" will be understood to refer to either a solar cell or a panel without distinction. Furthermore, TFPV devices may be fabricated on inexpensive substrates such as glass, plastics, and thin sheets of metal. Examples of suitable substrates comprise float glass, low-iron glass, borosilicate glass, flexible glass, flexible ceramics, specialty glass for high temperature processing, stainless steel, carbon steel, aluminum, cladded foils, copper, polyimide, plastics, etc. Furthermore, the substrates may be processed in many configurations such as single substrate processing, multiple substrate batch processing, inline continuous processing, roll-to-roll processing, etc.

The increasing demand for environmentally friendly, sustainable and renewable energy sources is driving the development of large area, thin film photovoltaic devices. With a long-term goal of providing a significant percentage of global energy demand, there is a concomitant need for Earth-abundant, high conversion efficiency materials for use in photovoltaic devices. A number of Earth abundant direct-bandgap semiconductor materials now seem to show evidence of the potential for both high efficiency and low cost in Very Large Scale (VLS) production (e.g. greater than 100 gigawatt (GW)), yet their development and characterization remains difficult because of the complexity of the materials systems involved.

Among the TFPV technologies, CIGS and CdTe are the two that have reached volume production with greater than 11% stabilized module efficiencies. Solar cell production volume must increase tremendously in the coming decades to meet sharply growing energy needs. However, the supply of In, Ga and Te may impact annual production of CIGS and CdTe solar panels. Moreover, price increases and supply constraints in In and Ga could result from the aggregate demand for these materials used in flat panel displays (FPD) and light-emitting diodes (LED) along with CIGS TFPV. Also, there are concerns about the toxicity of Cd throughout the lifecycle of the CdTe TFPV solar modules. Efforts to develop devices that leverage manufacturing and R&D infrastructure related to these TFPV technologies but using more widely available and more environmentally friendly raw materials should be considered a top priority for research. The knowledge and infrastructure developed around CdTe and CIGS TFPV technologies can be leveraged to allow faster adoption of new TFPV materials systems.

The immaturity of TFPV devices exploiting Earth abundant materials represents a daunting challenge in terms of the time-to-commercialization. That same immaturity also suggests an enticing opportunity for breakthrough discoveries. A quaternary system such as CIGS or CZTS requires management of multiple kinetic pathways, thermodynamic phase equilibrium considerations, defect chemistries, and interfacial control. The vast phase-space to be managed includes process parameters, source material choices, compositions, and overall integration schemes. The complexity of the intrinsically-doped, self-compensating, multinary, polycrystalline, queue-time-sensitive, thin-film absorber (CIGS), and its interfaces to up-, and down-stream processing, combined with the lack of knowledge on a device level to address efficiency losses effectively, makes it a highly empirical material system. The performance of any thin-film, (opto-) electronically-active device is extremely sensitive to its interfaces. Interface engineering for electronically-active devices is highly empirical. Traditional R&D methods are ill-equipped to address such complexity, and the traditionally slow pace of R&D could limit any new material from reaching industrial relevance when having to compete with the incrementally improving performance of already established TFPV fabrication lines, and continuously decreasing panel prices for more traditional cSi PV technologies.

However, due to the complexity of the material, cell structure and manufacturing process, both the fundamental scientific understanding and large scale manufacturability are yet to be improved for CIGS and CZTS TFPV devices. As the photovoltaic industry pushes to achieve grid parity, much faster and broader investigation is needed to explore the material, device, and process windows for higher efficiency and a lower cost of manufacturing process. Efficient methods for forming different types of CIGS and CZTS TFPV devices that can be evaluated are necessary.

The efficiency of TFPV devices depends on many properties of the absorber layer and the buffer layer such as crystallinity, grain size, composition uniformity, density, defect concentration, doping level, surface roughness, etc.

The manufacture of TFPV devices entails the integration and sequencing of many unit processing steps. As an example, TFPV manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as TFPV devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

HPC processing techniques have been adapted to the development and investigation of absorber layers and buffer layers for TFPV solar cells as described in U.S. application Ser. No. 13/236,430 filed on Sep. 19, 2011, entitled "COMBINATORIAL METHODS FOR DEVELOPING SUPERSTRATE THIN FILM SOLAR CELLS" and is incorporated herein by reference. However, HPC processing techniques have not been successfully adapted to the development of contact structures for TFPV devices. Generally, there are two basic configurations for TFPV devices. The first configuration is known as a "substrate" configuration. In this configuration, the contact that is formed on or near the substrate is called the back contact. In this configuration, the light is incident on the TFPV device from the top of the material stack (i.e. the side opposite the substrate). CIGS and CZTS TFPV devices are most commonly manufactured in this configuration. The second configuration is known as a "superstrate" configuration. In this configuration, the contact that is formed on or near the substrate is called the front contact. In this configuration, the light is incident on the TFPV device through the substrate. CdTe, and a-Si, TFPV devices are most commonly manufactured in this configuration. In both configurations, light trapping schemes may be implemented in the contact layer that is formed on or near the substrate. Additionally, other efficiency or durability improvements can be implemented in the contact layer that is formed farthest away from the substrate.

The price of solar devices continues to drop. The downward price trends put pressure on the solar device manufacturers to reduce costs in the areas of materials, labor, and manufacturing, while simultaneously increasing solar device efficiencies. For complex TFPV technologies such as CIGS, the cost contribution of the absorber layer may represent up to about 30% of the panel cost. To address this issue, attempts have been made to manufacture TFPV devices with much thinner absorber layers (i.e. in the range of about 0.5 um to about 0.7 um). Other methods are envisioned to increase the absorption efficiency of the light incident on the TFPV device such as anti-reflection coatings, light trapping schemes, etc. Therefore, there is a need to develop methods and device architectures that increase the effective power output of TFPV devices.

SUMMARY OF THE DESCRIPTION

In some embodiments of the present invention, methods for texturing the back contact layer of substrate TFPV devices are described. In some embodiments, the back contact layer is textured by first texturing the surface of the substrate prior to the deposition of the back contact layer. In some embodiments, the back contact layer is textured by stamping a pattern into a sol-gel material incorporated under the back contact. In some embodiments, the back contact layer is textured by suspending particles in a sol-gel material incorporated under the back contact. The sol-gel material can be electrically insulating or electrically conductive (i.e. based on conductive metal oxide compounds such as titanium oxide, indium oxide, tin oxide, etc.). In some embodiments, the back contact layer is textured by co-depositing two conductive materials with opposite gradient profiles throughout the film. Furthermore, the two conductive materials have different etch rates, yielding a textured surface after being subjected to an etch step following the deposition. The conductive materials may be metals, metal alloys, conductive binary metal compounds, etc. In some embodiments, the back contact layer is textured by co-depositing two conductive materials with opposite gradient profiles throughout the film. Furthermore, the two conductive materials are immiscible and will separate into distinct phases after an anneal step. Annealing the deposited film with an energy source such as a resistively heated furnace, inline anneal system, laser, IR lamps, flash lamps, etc. results in a textured surface.

In some embodiments of the present invention, methods for texturing the front contact layer of superstrate TFPV devices are described. In some embodiments, the front contact layer is textured by first texturing the surface of the substrate prior to the deposition of the front contact layer. In some embodiments, the front contact layer is textured by stamping a pattern into a sol-gel material incorporated under the front contact. In some embodiments, the front contact layer is textured by suspending particles in a sol-gel material incorporated under the front contact. The sol-gel material can be electrically insulating or electrically-conductive. In some embodiments, the front contact layer is textured by co-depositing two conductive materials with opposite gradient profiles throughout the film. Furthermore, the two conductive materials have different etch rates, yielding a textured surface after being subjected to an etch step following the deposition. The conductive materials may be metals, metal alloys, conductive binary metal compounds, etc. In some embodiments, the front contact layer is textured by co-depositing two conductive materials with opposite gradient profiles throughout the film. Furthermore, the two conductive materials are immiscible and will separate into distinct phases after an anneal step. Annealing the deposited film with an energy source such as a resistively heated furnace, inline anneal system, laser, IR lamps, flash lamps, etc. results in a textured surface. As used herein, conductive materials will be understood to have a sheet resistance of less than about $250\Omega/\square$. As used herein, non-conductive materials will be understood to have a sheet resistance of greater than about $1000\Omega/\square$. Materials with a sheet resistance of between about $250\Omega/\square$ and $1000\Omega/\square$ will be understood to be either conducting or non-conducting.

In some embodiments, a material is deposited using nanoparticles using a wide variety of delivery systems such as liquids, inks, pastes, sol-gels, colloids, etc. applied using common techniques such as spin coating, dipping, spraying, ink-jet printing, screen printing, roller coating, casting, slot die coating, curtain coating, capillary coating, etc. The nanoparticles may be either conducting or non-conducting. When delivered using a sol-gel delivery method, the nanoparticles may be derived from the same material as the sol-gel or may be derived from a different material. In some embodiments, a conductive material and a non-conducting material are co-deposited based on typical nanoparticle delivery systems. After drying and sintering, the non-conductive material may be partially or completely removed leaving a textured conductive material. The sintering may be accomplished using a thermal, optical (i.e. UV light), or chemical method. In some embodiments, one or more non-conducting material(s) are (co-)deposited based on typical nanoparticle delivery systems. After drying and sintering, with/without a subsequent removal step, the non-conductive material(s) exhibit a textured surface. A conductive material is subsequently deposited upon the textured surface. In some embodiments, a non-conducting material is deposited based on typical nanoparticle delivery systems. After partial or complete drying and prior to sintering, the non-conductive material can be textured by mechanical techniques such as stamping, rolling, ion milling, etc. Alternatively, the non-conducting material may comprise a range of particle sizes. The non-conducting layer may then be heated under appropriate conditions to convert the material into a conducting layer. Examples of heating techniques comprise laser annealing, flash lamps, etc. In some embodiments, a metal oxide material is deposited based on typical nanoparticle delivery systems. The metal oxide material may exhibit texturing as deposited or may be purposely textured as described earlier. After drying and sintering, the metal oxide material may then be heated under appropriate conditions (i.e. in a reducing atmosphere) to convert the material into a conducting material. Examples of heating techniques comprise laser annealing, flash lamps, etc.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIGS. 5A-5C illustrate the evolution of the surface structure according to some embodiments described herein.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

As used herein, "CIGS" will be understood to represent the entire range of related alloys denoted by $Cu_zIn_{(1-x)}Ga_xS_{(2+w)(1-y)}Se_{(2+w)y}$, where $0.5 \leq z \leq 1.5$, $0 \leq x \leq 1$, $0 \leq y \leq 1$, $-0.2 \leq w \leq 0.5$ As used herein, "CZTS" will be understood to represent the entire range of related alloys denoted by $Cu_zZn_wSn_x(S_ySe_{1-y})_4$ where $0 \leq y \leq 1$ and w, x, and z range from 0 to about 2. Similarly, as noted above, other materials (i.e. Ag, Au, Cd, Ge, etc.) may be incorporated as potential absorber layers. Also as mentioned previously, any of these materials may be further doped with a suitable dopant.

Figure 3:
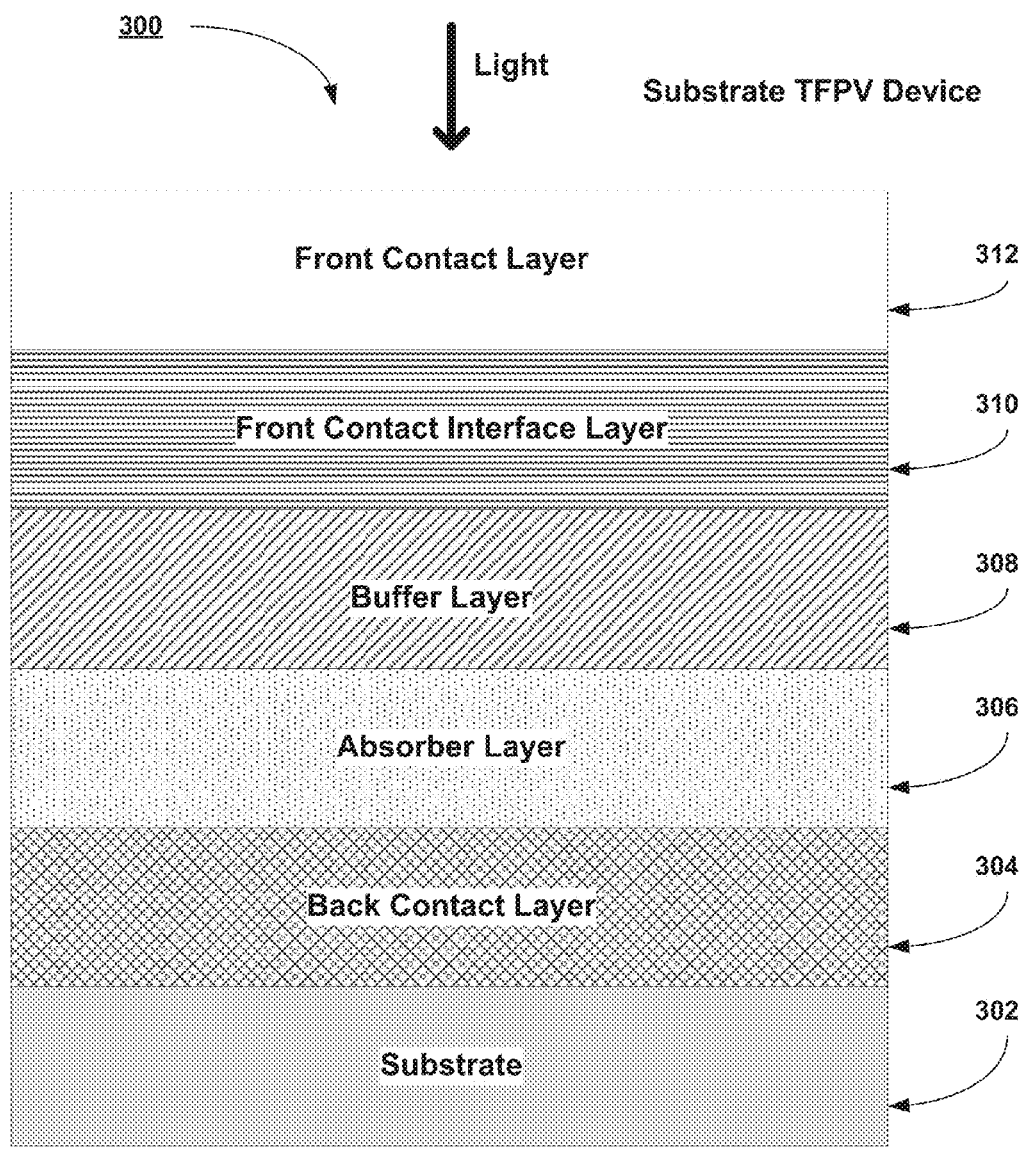
FIG. 3 illustrates a schematic diagram of a simple substrate TFPV stack according to an embodiment described herein.
Figure 4:
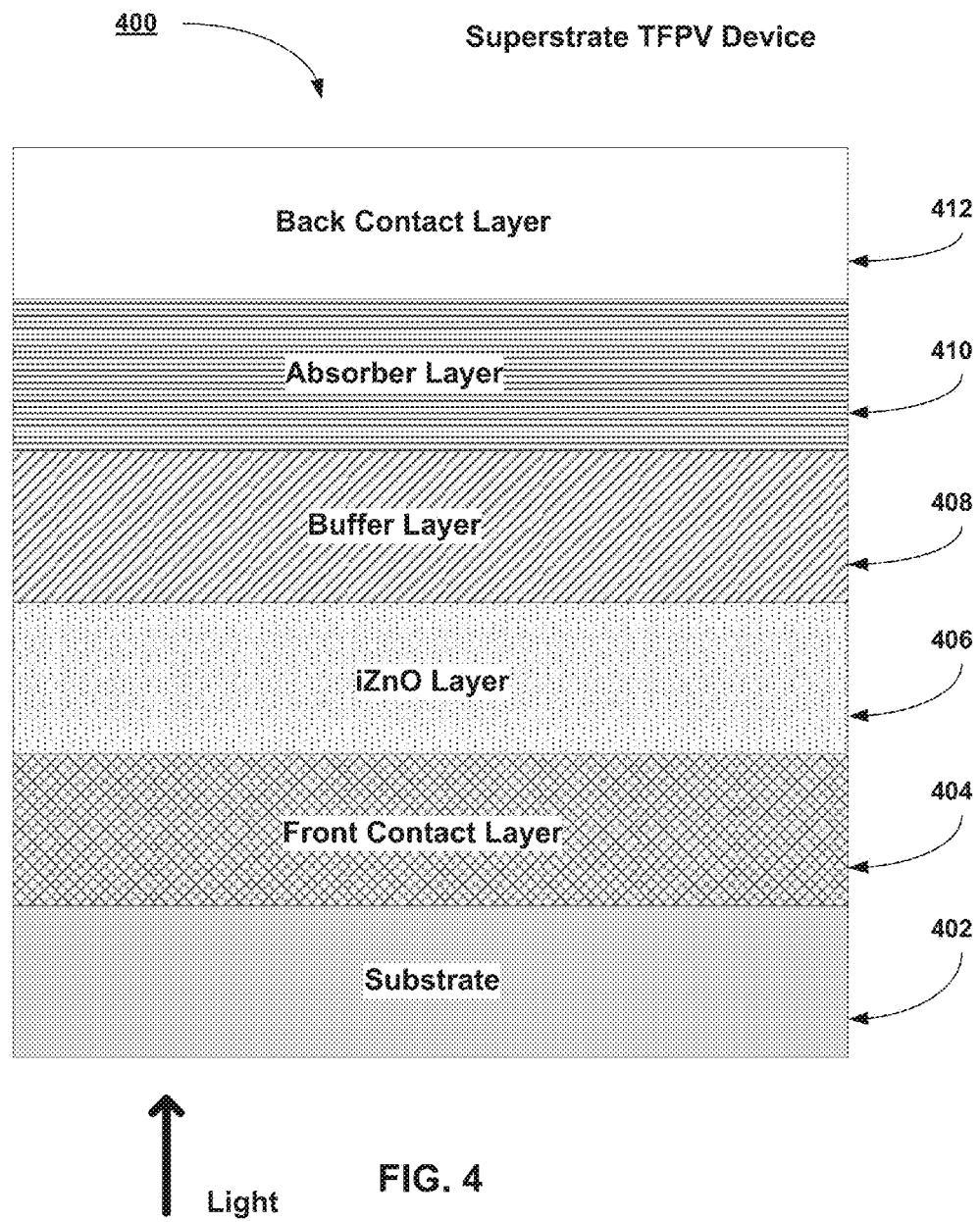
FIG. 4 illustrates a schematic diagram of a simple superstrate TFPV stack according to an embodiment described herein.

In FIGS. 3-4 below, a TFPV material stack is illustrated using a simple planar structure. Those skilled in the art will appreciate that the description and teachings to follow can be readily applied to any simple or complex TFPV solar cell morphology. The drawings are for illustrative purposes only and do not limit the application of the present invention.

Figure 1:
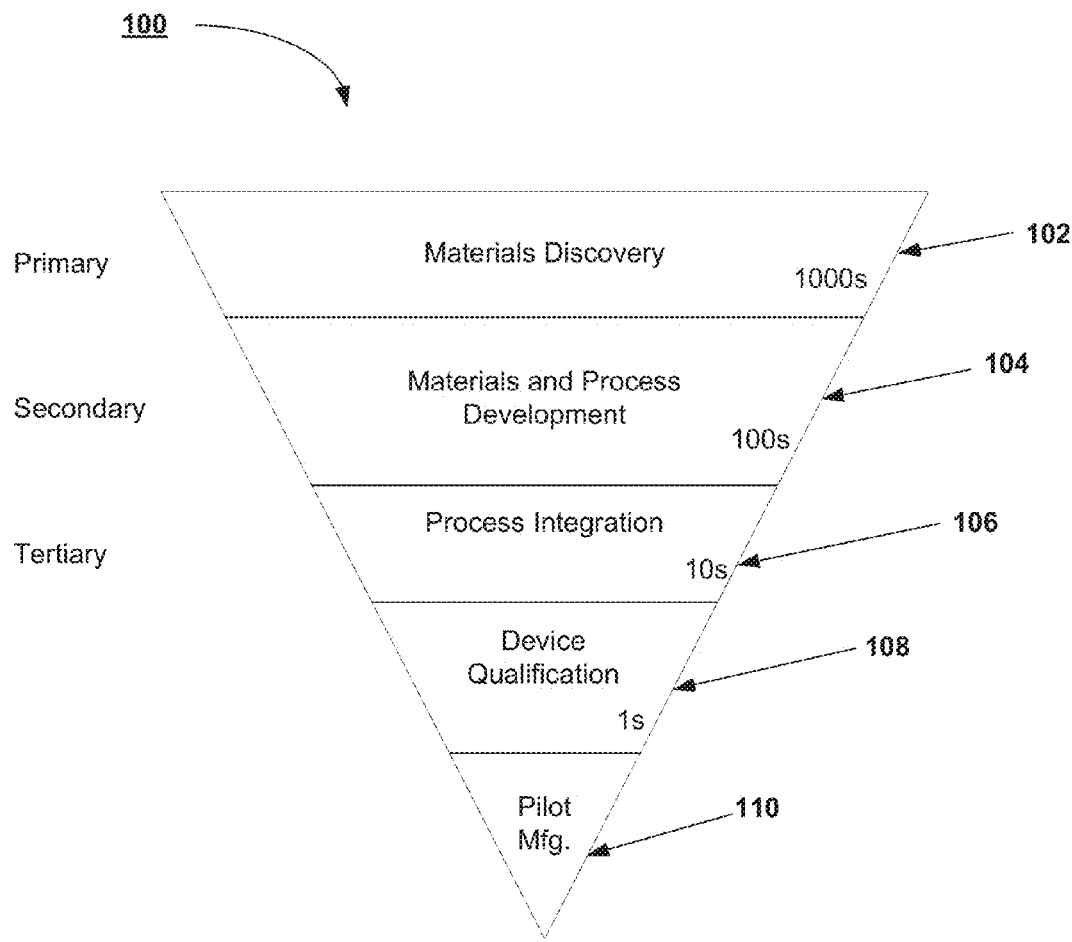
FIG. 1 is a schematic diagram for implementing combinatorial processing and evaluation.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of TFPV manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a TFPV device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a TFPV device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the TFPV device. For example, such structures may include, but would not be limited to, contact layers, buffer layers, absorber layers, or any other series of layers or unit processes that create an intermediate structure found on TFPV devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
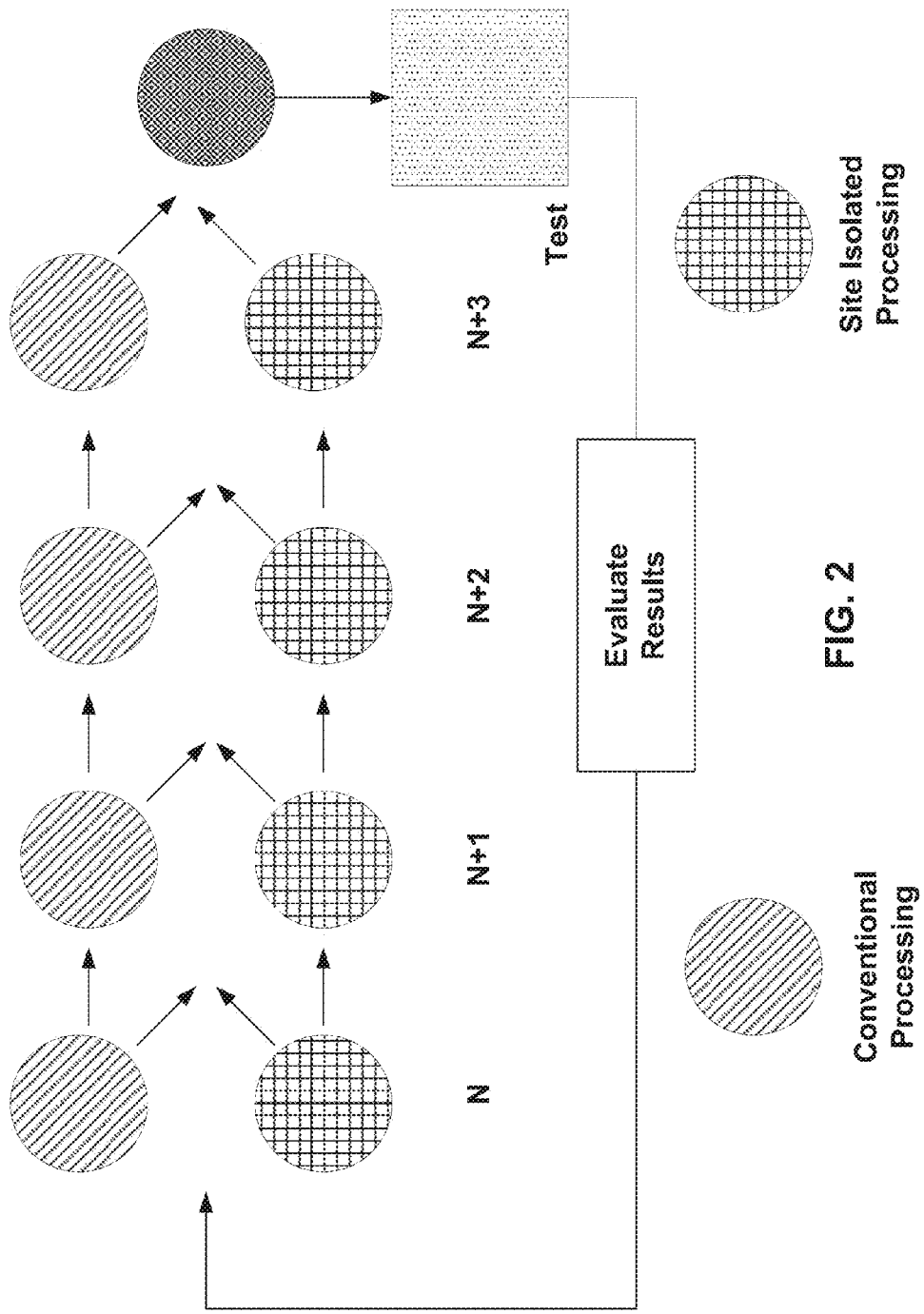
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in TFPV manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

FIG. 3 illustrates a schematic diagram of a simple TFPV device stack in the substrate configuration consistent with some embodiments of the present invention. The convention will be used wherein light is assumed to be incident upon the top of the material stack in the substrate configuration as illustrated. This generic diagram would be typical of either a CIGS TFPV device or a CZTS TFPV device. The difference being the choice of materials for the absorber layer. A back contact layer, 304, is formed on a substrate, 302. Examples of suitable substrates comprise float glass, low-iron glass, borosilicate glass, flexible glass, specialty glass for high temperature processing, stainless steel, carbon steel, aluminum, copper, titanium, molybdenum, polyimide, plastics, cladded metal foils, etc. Furthermore, the substrates may be processed in many configurations such as single substrate processing, multiple substrate batch processing, inline continuous processing, roll-to-roll processing, etc. As used herein, the phrase "back contact" will be understood to be the primary current conductor layer situated between the substrate and the absorber layer in a substrate configuration TFPV device. An example of a common back contact layer material is Mo for CIGS and CZTS. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices. The back contact layer may be formed by any number of deposition technologies. Examples of suitable deposition technologies comprise PVD (sputtering), evaporation, chemical vapor deposition (CVD), atomic layer deposition (ALD), plating, printing, wet coating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others.

Optionally, a diffusion barrier layer (not shown) may be formed between the substrate and the back contact layer. When implemented, the diffusion barrier layer stops the diffusion of impurities from the substrate into the back contact layer, or alternatively, stops the diffusion and reaction of the back contact material into the substrate. Examples of common diffusion barrier layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed from any well known technique such as sputtering, CVD, evaporation, wet methods such as printing or spraying of inks, screen printing, inkjet printing, slot die coating, gravure printing, wet chemical depositions, or from sol-gel methods such as the coating, drying, and firing of polysilazanes.

A p-type absorber layer, 306, of CIGS (CZTS or other material) is then deposited on top of the back contact layer. The absorber layer may be formed using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is contained in the absorber layer. The Na may be added by out-diffusion from the SLG substrate or may be purposely added in the form of $Na_2Se$ or another sodium source, prior, during, or after the deposition of the absorber layer. Optionally, the absorber layer undergoes a selenization process after formation to convert the precursor to CIGS into a high-quality CIGS semiconductor film. The selenization process involves the exposure of the absorber layer to $H_2Se$, $H_2S$, Se vapor, S vapor, or diethylselenide (DESe) at temperatures most typically between about 300C and 700C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. During the selenization process, a layer of $Mo(S)Se_2$ (not shown) forms at the back contact/absorber layer interface and forms a fairly good ohmic contact between the two layers. Alternatively, a layer of $Mo(S)Se_2$ (not shown) can be deposited at the back contact/absorber layer interface using a variety of well known techniques such as CBD, ALD, plating, etc. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

An n-type buffer layer, 308, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS or CZTS TFPV devices. The buffer layer may be deposited using chemical bath deposition (CBD), chemical surface deposition (CSD), PVD (sputtering), printing, plating, ALD, Ion-Layer-Gas-Reaction (IL-GAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

Optionally, an intrinsic ZnO (iZnO) layer, 310, is then formed on top of the buffer layer. The iZnO layer is a high resistivity material and forms part of the transparent conductive oxide (TCO) stack that serves as part of the front contact structure. The TCO stack is formed from transparent conductive metal oxide materials and collects charge across the face of the TFPV solar cell and conducts the charge to tabs used to connect the solar cell to external loads. The iZnO layer makes the TFPV solar cell less sensitive to lateral non-uniformities caused by differences in composition or defect concentration in the absorber and/or buffer layers. The iZnO layer is typically between about 0 nm and 150 nm in thickness. The iZnO layer is typically formed using a (reactive) PVD (sputtering) technique or CVD technique, but can be deposited by plating or printing as well. A low resistivity top TCO layer, 312, (examples include Al:ZnO (AZO), InSnO (ITO), InZnO, B:ZnO, Ga:ZnO, F:ZnO, $F:SnO_2$, etc.) is formed on top of the iZnO layer. The top TCO layer is typically between about 0.25 um and 1.0 um in thickness. The top TCO layer is typically formed using a (reactive) PVD technique or CVD technique. Optionally, the transparent top electrode can be printed or wet-coated from nano-wires, carbon nanotubes, and the like.

FIG. 4 illustrates a simple CIGS TFPV device material stack, 400, consistent with some embodiments of the present invention. The CIGS TFPV device illustrated in FIG. 4 is shown in a superstrate configuration wherein the glass substrate faces the incident sunlight. The convention will be used wherein light is assumed to be incident upon the substrate and material stack as illustrated. The formation of the CIGS TFPV device will be described starting with the substrate. A similar structure and similar method would also be applicable to the formation of a CZTS TFPV solar cell fabricated with a superstrate configuration. Examples of suitable substrates comprise float glass, low-iron glass, borosilicate glass, flexible glass, specialty glass for high temperature processing, polyimide, plastics, etc. Furthermore, the substrates may be processed in many configurations such as single substrate processing, multiple substrate batch processing, inline continuous processing, roll-to-roll processing, etc.

A low resistivity bottom TCO front contact layer, 404, (examples include Al:ZnO (AZO), InSnO (ITO), InZnO, B:ZnO, Ga:ZnO, F:ZnO, $F:SnO_2$, etc.) is formed on top of the substrate, 402. As used herein, the phrase "front contact" will be understood to be the primary current conductor layer situated between the substrate and the buffer layer in a superstrate configuration TFPV device. The bottom TCO layer is typically between about 0.3 um and 2.0 um in thickness. The bottom TCO layer is typically formed using a reactive PVD (sputtering) technique or CVD technique.

Optionally, a diffusion barrier layer (not shown) may be formed between the substrate and the back contact layer. When implemented, the diffusion barrier layer stops the diffusion of impurities from the substrate into the TCO, or alternatively, stops the diffusion and reaction of the TCO material and above layers into the substrate. Examples of common diffusion barrier layers comprise chromium, vanadium, tungsten, nitrides such as tantalum nitride, tungsten nitride, titanium nitride, silicon nitride, zirconium nitride, hafnium nitride, oxy-nitrides such as tantalum oxy-nitride, tungsten oxy-nitride, titanium oxy-nitride, silicon oxy-nitride, zirconium oxy-nitride, hafnium oxy-nitride, oxides such as aluminum oxide, silicon oxide, carbides such as silicon carbide, binary and/or multinary compounds of tungsten, titanium, molybdenum, chromium, vanadium, tantalum, hafnium, zirconium, and/or niobium with/without the inclusion of nitrogen and/or oxygen. The diffusion barrier layer may be formed from any well known technique such as sputtering, CVD, evaporation, wet methods such as printing or spraying of inks, screen printing, inkjet printing, slot die coating, gravure printing, wet chemical depositions, or from sol-gel methods such as the coating, drying, and firing of polysilazanes.

An intrinsic iZnO layer, 406, is then formed on top of the TCO layer. The iZnO layer is a high resistivity material and forms part of the transparent conductive oxide (TCO) stack that serves as part of the front contact structure. The iZnO layer makes the TFPV device less sensitive to lateral non-uniformities caused by differences in composition or defect concentration in the absorber and/or buffer layers. The iZnO layer is typically between about 0 nm and 150 nm in thickness. The iZnO layer is typically formed using a reactive PVD (sputtering) technique or CVD technique.

An n-type buffer layer, 408, is then deposited on top of the absorber layer. Examples of suitable n-type buffer layers comprise CdS, ZnS, $In_2S_3$, $In_2(S,Se)_3$, CdZnS, ZnO, Zn(O, S), (Zn,Mg)O, etc. CdS is the material most often used as the n-type buffer layer in CIGS or CZTS TFPV devices. The buffer layer may be deposited using chemical bath deposition (CBD), chemical surface deposition (CSD), PVD (sputtering), printing, plating, ALD, Ion-Layer-Gas-Reaction (IL-GAR), ultrasonic spraying, or evaporation. The thickness of the buffer layer is typically between about 30 nm and about 100 nm. The performance of the buffer layer is sensitive to materials properties such as crystallinity, grain size, surface roughness, composition, defect concentration, etc. as well as processing parameters such as temperature, deposition rate, thermal treatments, etc.

A p-type absorber layer, 410, of CIGS (CZTS or other IB-IIIA-VIA material) is then deposited on top of the buffer layer. The absorber layer may be formed using a variety of techniques such as PVD (sputtering), co-evaporation, in-line evaporation, plating, printing or spraying of inks, screen printing, inkjet printing, slot die coating, gravure printing, wet chemical depositions, CVD, etc. Advantageously, the absorber layer is deficient in Cu. The Cu deficiency may be controlled by managing the deposition conditions. Advantageously, a small amount of Na is contained in the absorber layer. The Na may be purposely added in the form of $Na_2Se$ or another sodium source, prior, during, or after the deposition of the absorber layer. Optionally, the absorber layer undergoes a selenization process after formation to convert the precursor to CIGS into a high-quality CIGS semiconductor film. The selenization process involves the exposure of the absorber layer to $H_2Se$, $H_2S$, Se vapor, S vapor, or diethylselenide (DESe) at temperatures most typically between about 300C and 700C. It should be noted that the precursor to CIGS might already contain a chalcogen source (e.g. Se), either as a separate layer, or incorporated into the bulk of the precursor layer. The precursor film can be a stack of layers, or one layer. The precursor layer can be dense, or porous. The precursor film typically contains Cu, In, and Ga. The precursor layer is most commonly deposited by sputtering from e.g. binary copper-gallium and Indium sputter targets. Nevertheless, plating and printing to deposit the metal precursor film containing Cu, In, and/or Ga are used as well. During subsequent processing, a layer of $Mo(S)Se_2$ (not shown) forms at the back contact/absorber layer interface and forms a fairly good ohmic contact between the two layers. The thickness of the absorber layer is typically between about 1.0 um and about 3.0 um. The performance of the absorber layer is sensitive to materials properties such as crystallinity, grain size, surface roughness, composition, defect concentration, etc. as well as processing parameters such as temperature, deposition rate, thermal treatments, etc.

A back contact layer, 412, is formed on absorber layer, 410. An example of a common back contact layer material is Mo for CIGS and CZTS. The back contact layer may be formed by any number of deposition technologies. Examples of suitable deposition technologies comprise PVD (sputtering), evaporation, chemical vapor deposition (CVD), atomic layer deposition (ALD), plating, etc. The thickness of the back contact layer is typically between about 0.3 um and about 1.0 um. The back contact layer has a number of requirements such as high conductivity, good ohmic contact to the absorber layer, ease of bonding to tabs for external connectivity, ease of scribing or other removal, good thermo-mechanical stability, and chemical resistance during subsequent processing, among others. Other types of TFPV devices use different materials for the back contact. As an example, Cu alloys such as Cu/Au, Cu/graphite, Cu/Mo, Cu:ZnTe, etc. are typically used for CdTe TFPV devices and TCO materials such as ZnO, ITO, $SnO_2$:F, etc. are typically used for a-Si TFPV devices.

The film stack described above is just one example of a film stack that can be used for TFPV devices. As an example, another substrate film stack might be: substrate/AZO/Mo/CIGS/CdS/iZnO/AZO. As an example, another superstrate film stack might be: substrate/barrier/ZnO:Al/Mo/CIGS/CdS/iZnO/ZnO:Al/Al. The detailed film stack configuration is not meant to be limiting, but simply serves as an example of the implementation of embodiments of the present invention.

In the discussions of the materials and layers discussed with respect to FIG. 3 and FIG. 4, typical deposition methods were listed for each layer. Additionally, in each case, all of the materials discussed above with respect to FIG. 3 and FIG. 4 can be deposited using deposition techniques based on nanopowders, nanoparticles, etc. Nanoparticles are generally defined as particles with sizes between about 1 nm and about 100 nm. As used herein, the term "nanoparticles" will be understood to cover all particle sizes from about 1 nm up to about 1000 nm. Nanoparticles can be formed from metal, dielectric, or semiconductor materials as well as hybrid structures wherein the core of the nanoparticles is different from an outer shell of the nanoparticles. The formation of nanoparticles is well understood.

Nanoparticles may be delivered in a wide variety of delivery systems such as liquids, inks, pastes, sol-gels, colloids, etc. Further, they may be applied using common techniques such as spin coating, dipping, spraying, ink-jet printing, screen printing, roller coating, casting, curtain coating, slot die coating, capillary coating, etc. The benefit of these techniques is that they are scalable to large area substrates, are scalable to high volume manufacturing, have acceptable material utilization rates, and are inexpensive. Generally, the nanoparticle solution or paste must be heated to evaporate the carrier medium. Additionally, the resulting nanoparticles film may be annealed or otherwise treated to influence properties such as density, conductivity, reflectivity, roughness, etc.

In some embodiments of the present invention, the back contact layer (for a substrate configuration) or the front contact layer (for a superstrate configuration) is textured by first texturing the substrate. Novel back contact structures that may also benefit from some embodiments of the present invention are described in U.S. patent application Ser. No. 13/251,509 entitled "Back Contacts for Thin Film Solar Cells" filed on Oct. 3, 2011 and is herein incorporated by reference for all purposes. For example, in the case of a substrate configuration, an optical reflector layer may be positioned between the portion of the back contact structure that carries most of the current and the ohmic contact layer that makes contact to the absorber layer. Typically, the optical reflector layer is sandwiched between two stress management/diffusion barrier layers that reduce the stresses within the film stack and prevent interdiffusion between the various layers of the film stack.

Typically, the substrate is a rigid material such as soda lime glass (SLG), also called float glass. However, the substrate may also be a flexible substrate such as a polymer or metal foil. In the case where the substrate is SLG, the substrate may be roughened using several different techniques. There are many definitions and formulas for calculating surface roughness, examples include arithmetic average of absolute values ($R_a$), root mean square ($R_{rms}$), maximum valley depth ($R_v$), maximum peak height ($R_p$), maximum height of the profile ($R_t$), skewness ($R_{sk}$), kurtosis ($R_{ku}$), etc. Generally, $R_a$ and $R_{rms}$ are the most commonly used definitions and methods of calculation. However, the discussion herein is applicable to any of the definitions and formulas for calculating surface roughness that may be used by those having skill in the art and the discussion is not limited to the specific definition and calculation method used.

In one technique applicable to all glass-based substrates, the glass is roughened by exposing the substrate to a wet chemical etchant such as HF. This process results in pitting and a roughening of the surface due to localized differences in the etch rate across the substrate surface. In a second technique, the glass may be rolled with hot rollers while it is still hot and pliable during the glass manufacturing process. This technique directly embosses a textured pattern into the surface of the substrate. In yet another technique, laser beams may be used to treat and roughen the surface of the substrate. Lasers are often used to etch or engrave glass and a similar principle can be used to roughen the surface of a substrate used for a TFPV solar panel. In yet another technique, mechanical texturing methods such as scribing, engraving, sandblasting, etc. may be used to treat and roughen the surface of the substrate. These techniques of etching, textured rolling, laser irradiation, and mechanical texturing can also be used for flexible substrates in a similar manner.

In some embodiments of the present invention, the back contact layer (for a substrate configuration) or the front contact layer (for a superstrate configuration) is textured by first depositing a sacrificial layer on the substrate before the deposition of the contact material. In FIG. 5A, a sol-gel material or nanoparticle material, 502, is applied to a substrate, 500. The substrate may be rigid or flexible as discussed previously. During the processing of the sol-gel material or nanoparticle material, a stamp, 504, is used to generate a pattern in the sol-gel material or nanoparticle material. Examples of sol-gel materials comprise silicon oxides, titanium oxides, indium oxides, tin oxides, etc. After curing, a textured surface comprising patterns of the sol-gel material or nanoparticle material are left on the surface of the substrate. The contact layer would then be deposited on top of this structure and would result in a textured contact layer.

In FIG. 5B, a second method of using a sol-gel material or nanoparticle material is illustrated. In FIG. 5B, a sol-gel material or nanoparticle material, 502, containing particles, 506, is applied to a substrate, 500. Examples of suitable particle materials include $SiO_x$, $TiO_x$ or other stable oxide particle that can be derived from nanopowders. After the processing of the sol-gel material or nanoparticle material, the sol-gel material or nanoparticle material is removed leaving the particles, 506, adhered to the surface of the substrate. The back contact layer would then be deposited on top of this structure and would result in a textured back contact layer. In some embodiments, HPC methodologies may be implemented to determine the optimum particle material, particle size etc. Parameters such as particle material, particle size distributions, particle shape distributions, particle concentration, sol-gel/nanoparticle viscosity, sol-gel/nanoparticle application parameters, sol-gel/nanoparticle curing parameters, sol-gel/nanoparticle film thickness, additives, silanes, etc. can be varied in a combinatorial manner to determine cost effective processing methods that improve the performance of the TFPV solar panel.

In FIG. 5C, a third method of using a sol-gel material or nanoparticle material is illustrated. In FIG. 5C, a sol-gel material or nanoparticle material, 502, containing particles, 506, is applied to a substrate, 500. The size of the particles is chosen such that they are larger than the sintered thickness of the sol-gel matrix or nanoparticle material, 508. During the processing of the sol-gel material or nanoparticle material, the matrix is sintered and captures the particles, 506, at the surface of the substrate. The back contact layer would then be deposited on top of this structure and would result in a textured back contact layer. In some embodiments, HPC methodologies may be implemented to determine the optimum particle material, particle size etc. Parameters such as particle material, particle size distributions, particle shape distributions, particle concentration, sol-gel/nanoparticle viscosity, sol-gel/nanoparticle application parameters, sol-gel/nanoparticle curing parameters, sol-gel/nanoparticle film thickness, additives, silanes, etc. can be varied in a combinatorial manner to determine cost effective processing methods that improve the performance of the TFPV solar panel.

In some embodiments of the present invention, sol-gel or nanoparticle material formulations are used that during deposition, drying, and/or curing result in cracking or an "orange-peel" surface morphology. After curing, these formulations will result in a roughened surface and the back contact would then be deposited on top of this structure and would result in a textured back contact layer. In some embodiments, HPC methodologies may be implemented to determine the optimum sol-gel processing parameters etc. Parameters such as particle material, particle size distributions, particle shape distributions, particle concentration, sol-gel/nanoparticle viscosity, sol-gel/nanoparticle application parameters, sol-gel/nanoparticle curing parameters, sol-gel/nanoparticle film thickness, additives, silanes, etc. can be varied in a combinatorial manner to determine cost effective processing methods that improve the performance of the TFPV solar panel.

In some embodiments of the present invention, sol-gel or nanoparticle material formulations are partially or completely cured on the substrate. The sol-gel or nanoparticle material surface is then roughened by bead-blasting, laser irradiation, or mechanical technique. The back contact layer would then be deposited on top of this structure and would result in a textured back contact layer. In some embodiments, HPC methodologies may be implemented to determine the optimum sol-gel or nanoparticle material processing and treatment parameters etc. Parameters such as sol-gel/nanoparticle viscosity, sol-gel/nanoparticle application parameters, sol-gel/nanoparticle curing parameters, sol-gel/nanoparticle film thickness, bead blasting media composition, bead blasting media size, bead blasting force, laser power, etc. can be varied in a combinatorial manner to determine cost effective processing methods that improve the performance of the TFPV solar panel.

In some embodiments of the present invention, a textured TCO layer can be deposited on the substrate prior to the deposition of the contact layer (i.e. "back" contact layer for substrate configurations and "front" contact layer for superstrate configurations). Textured TCO layers are known from their implementation in thin film Si solar panels. In this application, the textured TCO film would be much thinner since a high conductivity contact layer would be deposited on top of this structure and would result in a textured contact layer.

In some embodiments of the present invention, a partially or completely crystallized polycrystalline metallic layer (i.e. Al, Cu, etc.) is deposited on the substrate. The layer may be subjected to an additional heat treatment step to increase the crystallinity. The polycrystalline layer is then subjected to a wet etch process. Different crystalline and amorphous phases of material typically etch at different rates in wet etchants. Therefore, after the etch process, the polycrystalline layer will exhibit a rough, textured surface due to the different etch rates of the different crystalline phases. The contact layer (i.e. "back" contact layer for substrate configurations and "front" contact layer for superstrate configurations) would then be deposited on top of this structure and would result in a textured contact layer. In some embodiments, HPC methodologies may be implemented to determine the optimum metal deposition and treatment parameters etc. Parameters such as power, pressure film thickness, deposition rate, heat treatment temperature, heat treatment time, wet etch composition, wet etch concentration, wet etch time, wet etch temperature, etc. can be varied in a combinatorial manner to determine cost effective processing methods that improve the performance of the TFPV solar panel.

Figure 6A:
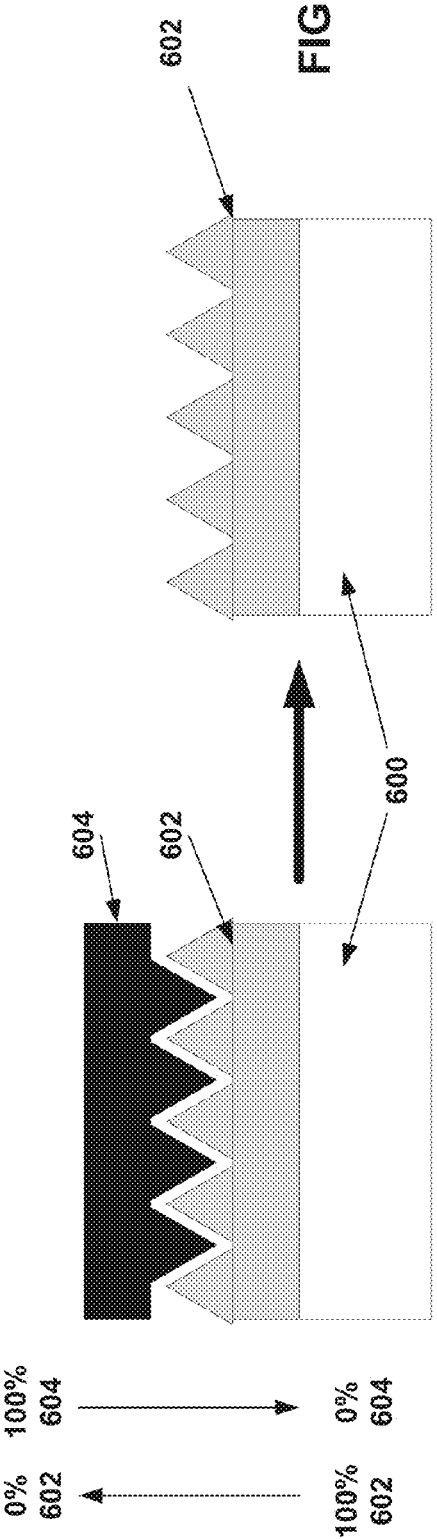
FIGS. 6A-6B illustrate the evolution of the surface structure according to some embodiments described herein.

In FIG. 6A, a mixture of two or more materials are co-deposited to form a layered structure wherein each material has a non-uniform distribution throughout the layer. In FIG. 6A, a first material, 602, is deposited on a substrate, 600. At the beginning of the deposition, the layer is substantially pure material, 602. As the deposition of the layer progresses, the concentration of material, 602, is slowly decreased and the concentration of a second material, 604, is slowly increased. At the end of the deposition, the layer is substantially pure material, 604. Throughout the transition zone between 100% material, 602, and 100% material, 604, a number of different alloys and phases will be formed. Optionally, the deposited material may be subjected to a heat treatment. As discussed above, these alloys and phases will have different etch rates when subjected to a wet etch process. As an example, the etch rate of material 604 may be much faster than the etch rate of material 602. After the etch process, the resulting surface of the layer (primarily consisting of material 602) will be rough and textured. In some embodiments, materials 602 and 604 can be selected that do not form alloys. One example of such a pair of materials includes Cu and Mo. Those skilled in the art will be able to determine other pairs of metals that have behavior by referring to published binary phase diagrams. Furthermore, those skilled in the art will appreciate that similar concepts can be extended to ternary or quaternary systems with similar results and benefits.

The concentration gradients of the materials throughout the layer thickness can be realized using a number of methods. If the materials are being deposited using PVD, then multiple targets may be used to co-sputter the materials. The power to each PVD source can be controlled to alter the flux of the material arriving at the substrate surface. The targets may be of a single composition or may be predetermined alloys. In a linear system configuration wherein the substrate passes sequentially through different processing zones or under sequential PVD sources, PVD targets having different alloy compositions may be used to generate the composition gradients throughout the layer thickness. As an example, the first target may be essentially pure material, 602. A second target in a second processing region may be 75% material 602 and 25% material 604. A third target in a third processing region may be 50% material 602 and 50% material 604. A fourth target in a fourth processing region may be 25% material 602 and 75% material 604. A fifth target in a fifth processing region may be essentially pure material, 604. These relative concentrations are for illustrative purposes only. Those skilled in the art will be able to devise appropriate target compositions to reach the desired result.

The discussion above has used bimetallic alloys as the example for forming composition gradients throughout the layer thickness. The same discussion and concept would hold for other bimetal material systems such as oxides, carbides, nitrides, borides, etc. In some embodiments, HPC methodologies may be implemented to determine the optimum metal or material deposition and treatment parameters etc. Parameters such as power, pressure film thickness, deposition rate, heat treatment temperature, heat treatment time, wet etch composition, wet etch concentration, wet etch time, wet etch temperature, etc. can be varied in a combinatorial manner to determine cost effective processing methods that improve the performance of the TFPV solar panel.

Figure 6B:
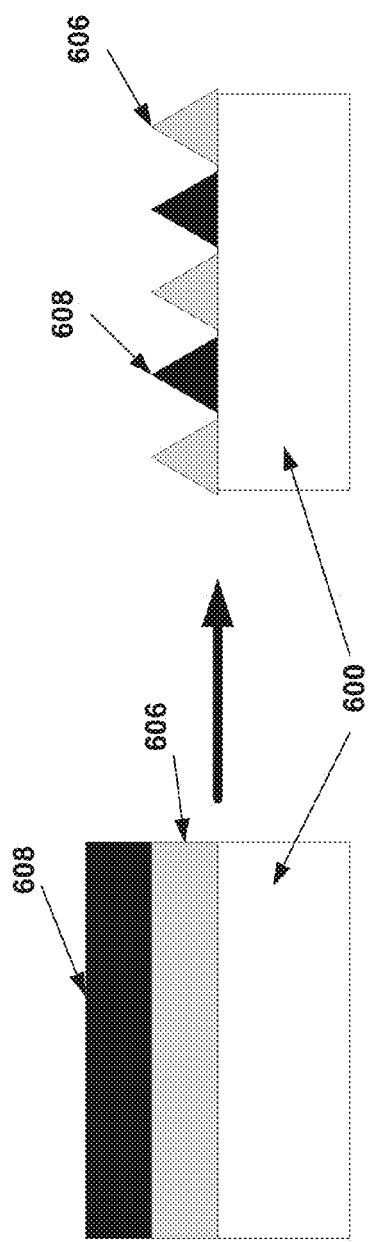

In FIG. 6B, a mixture of two or more materials are co-deposited to form a layered structure wherein each material has a non-uniform distribution throughout the layer. In FIG. 6B, a first material, 606, is deposited on a substrate, 600. At the beginning of the deposition, the layer is substantially pure material, 606. As the deposition of the layer progresses, the concentration of material, 606, is slowly decreased and the concentration of a second material, 608, is slowly increased. At the end of the deposition, the layer is substantially pure material, 608. Throughout the transition zone between 100% material, 606, and 100% material, 608, a number of different mixtures and phases will be formed. Optionally, the deposited material may be subjected to a heat treatment. The final distribution of phases in the layer may be different from the phases used to manufacture the sputtering target. In some embodiments, materials 606 and 608 can be selected that do not form alloys and will separate into different phases during the heat treatment. After the heat treatment, the layer may be subjected to a wet etch step resulting in a roughened surface. One example of such a pair of materials includes Cu and Mo. Exemplary materials comprise Al, Mo, W, Ta, Cr, Ni, Cu, or mixtures thereof. Those skilled in the art will be able to determine other pairs of metals that have behavior by referring to published binary phase diagrams. Furthermore, those skilled in the art will appreciate that similar concepts can be extended to ternary or quaternary systems with similar results and benefits.

The concentration gradients of the materials throughout the layer thickness can be realized using a number of methods. If the materials are being deposited using PVD, then multiple targets may be used to co-sputter the materials. The power to each PVD source can be controlled to alter the flux of the material arriving at the substrate surface. The targets may be of a single composition or may be a predetermined mixed composition. In a linear system configuration wherein the substrate passes sequentially through different processing zones or under sequential PVD sources, PVD targets having different atomic compositions may be used to generate the composition gradients throughout the layer thickness. As an example, the first target may be essentially pure material, 606. A second target in a second processing region may be 75% material 606 and 25% material 608. A third target in a third processing region may be 50% material 606 and 50% material 608. A fourth target in a fourth processing region may be 25% material 606 and 75% material 608. A fifth target in a fifth processing region may be essentially pure material, 608. These relative concentrations are for illustrative purposes only. Those skilled in the art will be able to devise appropriate target compositions to reach the desired result.

The discussion above has used bimetallic compounds as the example for forming composition gradients throughout the layer thickness. The same discussion and concept would hold for other bimetal material systems such as oxides, carbides, nitrides, borides, etc. In some embodiments, HPC methodologies may be implemented to determine the optimum metal or material deposition and treatment parameters etc. Parameters such as power, pressure film thickness, deposition rate, heat treatment temperature, heat treatment time, wet etch composition, wet etch concentration, wet etch time, wet etch temperature, etc. can be varied in a combinatorial manner to determine cost effective processing methods that improve the performance of the TFPV solar panel.

In some embodiments of the present invention, a back contact material (i.e. Mo) is deposited on a substrate. Laser beams may be used to treat and roughen the surface of the back contact material. Lasers are often used to etch or engrave glass, metal, etc. and a similar principle can be used to roughen the surface of a back contact material used for a TFPV solar panel.

In some embodiments, a material is deposited using nanoparticles using a wide variety of delivery systems such as liquids, inks, pastes, sol-gels, colloids, etc. applied using common techniques such as spin coating, dipping, spraying, ink-jet printing, screen printing, roller coating, casting, etc. In some embodiments, a conductive material and a non-conducting material are co-deposited using typical nanoparticle delivery systems. The particle sizes of both the conductive material and the non-conductive material may be varied to yield a textured surface. After drying and sintering, the non-conductive material is removed leaving a textured conductive material. The textured conductive material may be further annealed or otherwise treated to influence properties such as density, conductivity, reflectivity, roughness, etc.

In some embodiments, a material is deposited using nanoparticles using a wide variety of delivery systems such as liquids, inks, pastes, sol-gels, colloids, etc. applied using common techniques such as spin coating, dipping, spraying, ink-jet printing, screen printing, roller coating, casting, etc. In some embodiments, two or more non-conducting materials are co-deposited using typical nanoparticle delivery systems. The particle sizes of the two or more non-conductive materials may be varied to yield a textured surface. After drying and sintering, the non-conductive materials exhibit a textured surface. A conductive material is subsequently deposited upon the textured surface to yield a conductive surface with a textured surface. The textured conductive material may be further annealed or otherwise treated to influence properties such as density, conductivity, reflectivity, roughness, etc.

In some embodiments, a material is deposited using nanoparticles using a wide variety of delivery systems such as liquids, inks, pastes, sol-gels, colloids, etc. applied using common techniques such as spin coating, dipping, spraying, ink-jet printing, screen printing, roller coating, casting, etc. In some embodiments, a non-conducting material is deposited based on typical nanoparticle delivery systems. After drying and sintering, the non-conductive material can be textured by mechanical techniques such as stamping, rolling, ion milling, etc. Alternatively, the non-conducting material may comprise a range of particle sizes. The non-conducting material may then be heated under appropriate conditions to convert the material into a conducting material. Examples of heating techniques comprise laser annealing, flash lamps, etc. The textured conductive material may be further annealed or otherwise treated to influence properties such as density, conductivity, reflectivity, roughness, etc.

In some embodiments, a material is deposited using nanoparticles using a wide variety of delivery systems such as liquids, inks, pastes, sol-gels, colloids, etc. applied using common techniques such as spin coating, dipping, spraying, ink-jet printing, screen printing, roller coating, casting, etc. In some embodiments, a metal oxide material is deposited based on typical nanoparticle delivery systems. The metal oxide material may exhibit texturing as deposited (i.e. by varying the particle size distribution) or may be purposely textured as described earlier. After drying and sintering, the metal oxide material may then be heated under appropriate conditions (i.e. in a reducing atmosphere) to convert the material into a conducting material. Examples of heating techniques comprise laser annealing, flash lamps, etc. The textured conductive material may be further annealed or otherwise treated to influence properties such as density, conductivity, reflectivity, roughness, etc.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a thin film photovoltaic device, the method comprising:
   co-depositing at least two materials on a surface of a substrate to form a layer on the surface of the substrate, the layer comprising the at least two materials, wherein a concentration of a first material of the at least two materials within the layer decreases as the layer extends from the surface of the substrate and a concentration of a second material of the at least two materials within the layer increases as the layer extends from the surface of the substrate, wherein the first material and the second material do not form an alloy, and wherein one of the first material and the second material comprises copper and the other of the first material and the second material comprises molybdenum;
   performing a heat treatment to the layer;
   applying a wet etch process to the layer after the performing of the heat treatment, wherein during the wet etch process, the second material is etched faster than the first material is etched such that a surface of the layer is textured after the applying of the wet etch process; and
   after applying the wet etch process, forming a back contact layer on the surface of the layer, wherein the back contact layer comprises copper, molybdenum, gold, zinc, tellurium, graphite, or a combination thereof;
   forming a p-type absorber layer on the back contact layer;
   forming an n-type buffer layer on the p-type absorber layer; and
   forming a front contact layer on the n-type buffer layer.

2. A method for forming a thin film photovoltaic device, the method comprising:
   co-depositing a first conductive material and a second conductive material on a surface of a substrate to form a layer, wherein a concentration of the first conductive material within the layer decreases as the layer extends from the surface of the substrate and a concentration of the second conductive material within the layer increases as the layer extends from the surface of the substrate, and wherein the first conductive material and the second conductive material do not form an alloy, wherein one of the first conductive material and the second conductive material comprises copper and the other of the first conductive material and the second conductive material comprises molybdenum;

performing a wet etch process to the layer, wherein during the wet etch process, the second conductive material is etched faster than the first conductive material is etched such that a surface of the layer is textured; and after the performing of the wet etch process, forming a back contact layer on the layer;

forming a p-type absorber layer on the back contact layer;

forming an n-type buffer layer on the p-type absorber layer; and forming a front contact layer on the n-type buffer layer.

3. The method of claim 2 wherein the back contact layer comprises copper, molybdenum, gold, zinc, tellurium, graphite, or a combination thereof.

4. The method of claim 3 further comprising performing a heat treatment on the layer before the performing of the wet etch process.

5. The method of claim 4, wherein the front contact layer comprises a transparent conductive oxide.

6. The method of claim 2 wherein the forming of the layer comprises co-depositing the first material and the second material from separate PVD sources.

7. The method of claim 2 wherein the forming of the layer comprises co-depositing the first material and the second material from a plurality of PVD sources, wherein the plurality of PVD sources comprise targets composed of a mixture of the first material and the second material.

* * * * *